US011574675B2

(12) United States Patent
Kumar et al.

(10) Patent No.: US 11,574,675 B2
(45) Date of Patent: Feb. 7, 2023

(54) TEMPERATURE TRACKED DYNAMIC KEEPER IMPLEMENTATION TO ENABLE READ OPERATIONS

(71) Applicant: Synopsys, Inc., Mountain View, CA (US)

(72) Inventors: Vinay Kumar, Aligarh (IN); Saurabh Porwal, Greater Noida (IN); Sudhir Kumar, Delhi (IN); Madhav Mansukh Padaliya, Jamnagar (IN); Amit Khanuja, New Delhi (IN)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 17/133,103

(22) Filed: Dec. 23, 2020

(65) Prior Publication Data

US 2021/0193219 A1 Jun. 24, 2021

(30) Foreign Application Priority Data

Dec. 24, 2019 (IN) ............................. 201911053697

(51) Int. Cl.
*G11C 11/419* (2006.01)
*G11C 11/418* (2006.01)

(52) U.S. Cl.
CPC .......... *G11C 11/419* (2013.01); *G11C 11/418* (2013.01)

(58) Field of Classification Search
CPC ...... G11C 11/41; G11C 11/412; G11C 11/413; G11C 11/417; G11C 11/418; G11C 11/419
USPC ............................................. 365/189.15, 154
See application file for complete search history.

(56) References Cited

U.S. PATENT DOCUMENTS 5,826,056 A * 10/1998 Noda .................... G11C 7/1072
365/205

FOREIGN PATENT DOCUMENTS

WO WO-2015099748 A1 * 7/2015 ............. G11C 17/18

\* cited by examiner

*Primary Examiner* — Alfredo Bermudez Lozada
(74) *Attorney, Agent, or Firm* — Nicholson De Vos Webster & Elliott LLP; Judith Szepesi

(57) ABSTRACT

A static random access memory (SRAM) system includes a plurality of SRAM storage cells, each of the plurality of SRAM storage cells coupled to a respective read bit line, and a dynamic keeper coupled to the read bit line. The dynamic keeper includes a first keeper to support a read operation at a first temperature range, and a second keeper to support the read operation at a second temperature range, and a temperature-sensitive control circuit to select the first keeper or the second keeper based on temperature.

20 Claims, 10 Drawing Sheets

TEMPERATURE TRACKED DYNAMIC KEEPER IMPLEMENTATION TO ENABLE READ OPERATIONS

RELATED APPLICATION

The present application claims priority to Indian Application IN 201911053697 filed on Dec. 24, 2019 and incorporates that application in its entity by reference.

TECHNICAL FIELD

The present disclosure relates to Static Random-Access Memory (SRAM), and more particularly a system and method for providing a temperature tracked dynamic keeper implementation to enable read/write operations of the SRAM at low voltages and/or high temperatures.

BACKGROUND

A typical six transistor (6T) SRAMs may experience operational failures at low voltages due to degradation in various design parameters such as static noise margin (SNM), poor read and write margins, and exponentially increased sensitivity to process, voltage, and temperature (PVT) fluctuation. State-of-the-art ultra-low voltage SRAM design techniques circumvent these limitations of the conventional 6T SRAMs by using an eight transistor (8T) SRAM cell with a separated read port for decoupling read operations and write operations. However, 8T SRAM cells suffer data dependent Read Bit Line (RBL) leakage through their read port, which deteriorates the read sensing margin in terms of voltage and time window caused by small ratios of currents for on and off states (ION-to-IOFF) at ultra-low voltages.

Typical solutions to this issue include the use of a fixed-strength keeper or bigger bit cell (10T cell). A fixed-strength keeper introduces issues at low voltage/low temperature or high voltage/high temperatures. The use of a bigger bit cell increases the area and thus is not a practical solution.

FIG. 1 shows a typical 8T SRAM organization. Each row of cells 110A/110C and 110B/110D has a Read Word Line (RWL) 120A/120B attached to the read ports and a Write Word Line (WWL) 130A/130B attached to the write ports of the 6T (6 transistor) SRAM cells 110A-110D. Each column has a pair of complementary Write BitLines (WBL and WBLB) 125A, 125B and 135A, 135B for writing into the cell 110A-110D and Read BitLines (RBL) 140, 145 for reading from the cells 110A-110D. The write operation of the 8T SRAM is the same as that of a 6T SRAM, whose read operation is performed through the read port. The data is read from the cell 110A through transistors MO and M1, providing a decoupled read port.

One way of addressing this issue is by inserting a keeper into the SRAM. A keeper is configured to maintain a voltage level on read bit line during a read operation. The use of keeper circuits, or keepers, is a common technique for 8T SRAM single bitline read architecture. The keeper is a feedback circuit that helps the read bitline maintain at the full rail to compensate the leakage current of unselected bitcells during the read1 operation. However, there is a risk that the keeper over-compensates. In a read1 operation (reading a value "1" from an SRAM cell 110A-110D), read bit-line must not discharge below the trip point on inverter. If the current on the Read bit line falls due to the leakage path, then the inverter trips and false data is captured at the output. Read1 failure occurs at higher temperatures as higher temperatures contribute higher leakage.

FIG. 2 depicts signal sensing through a Sense_INV inverter and a weak PMOS keeper 240 (N series PMOS) for 8T SRAM cell 210. This scheme suffers from difficulty performing a Read '0' at SF (Slow NMOS Fast PMOS) corner and low temperature that limits the lowest operating voltage and degrades performance at a normal operating range.

SUMMARY

A static random access memory (SRAM) system includes a plurality of SRAM storage cells and a dynamic keeper coupled to a read bit line. The dynamic keeper includes a first keeper to support a read operation at a first temperature range, and a second keeper to support the read operation at a second temperature range, and a temperature-sensitive control circuit to select the first keeper or the second keeper based on temperature.

A method of providing a dynamic keeper to maintain signal in a static random access memory (SRAM) read bit line includes coupling a dynamic keeper to the read bit line, the dynamic keeper including a first keeper and a second keeper. The method further includes receiving a signal from a temperature-sensitive control circuit based on a temperature to select the first keeper at a first temperature range or the second keeper at the second temperature range. The dynamic keeper is designed to provide support to the read bit line.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
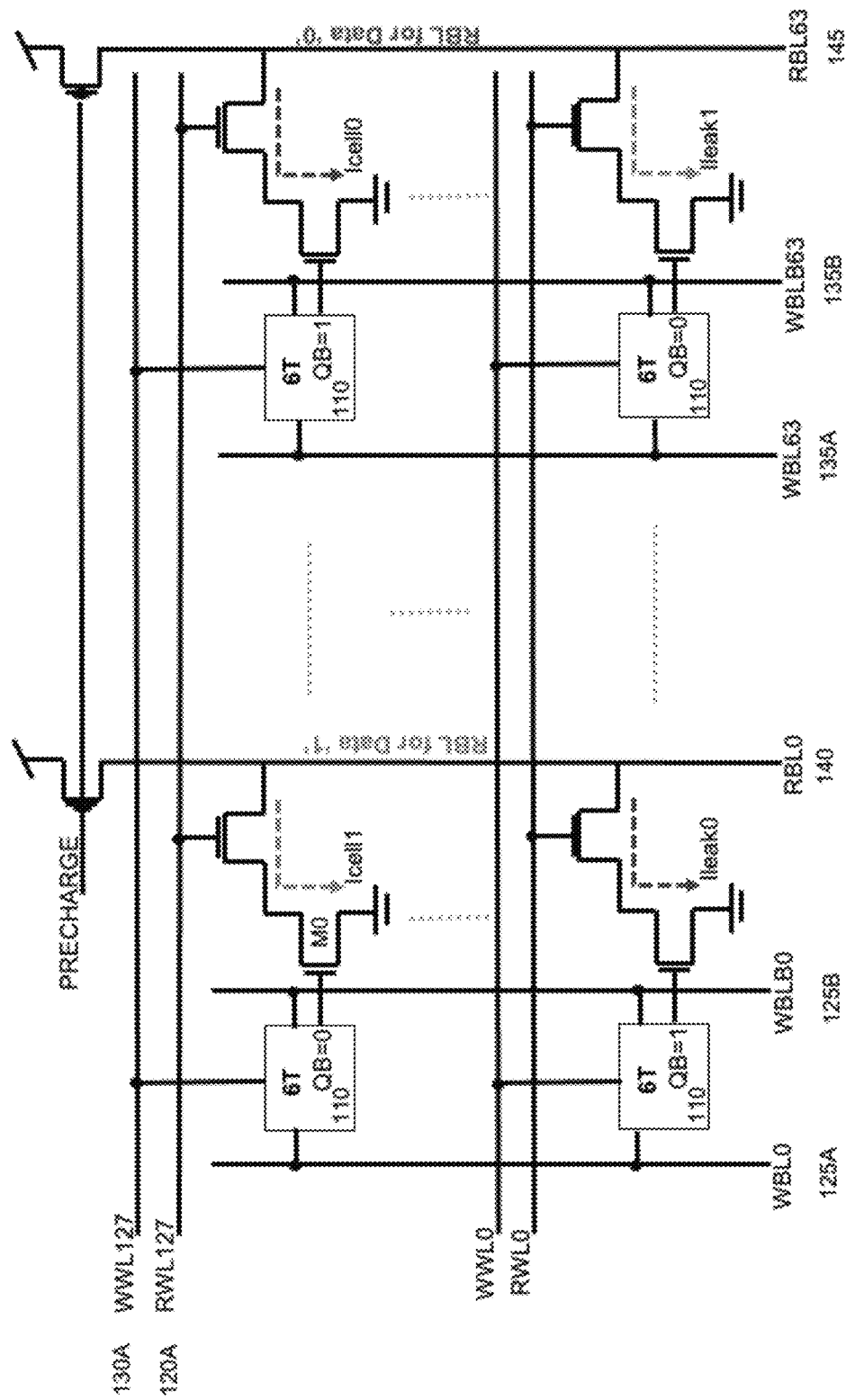
FIG. 1 is an illustration of a 8T SRAM, with a decoupled read port.
Figure 2:
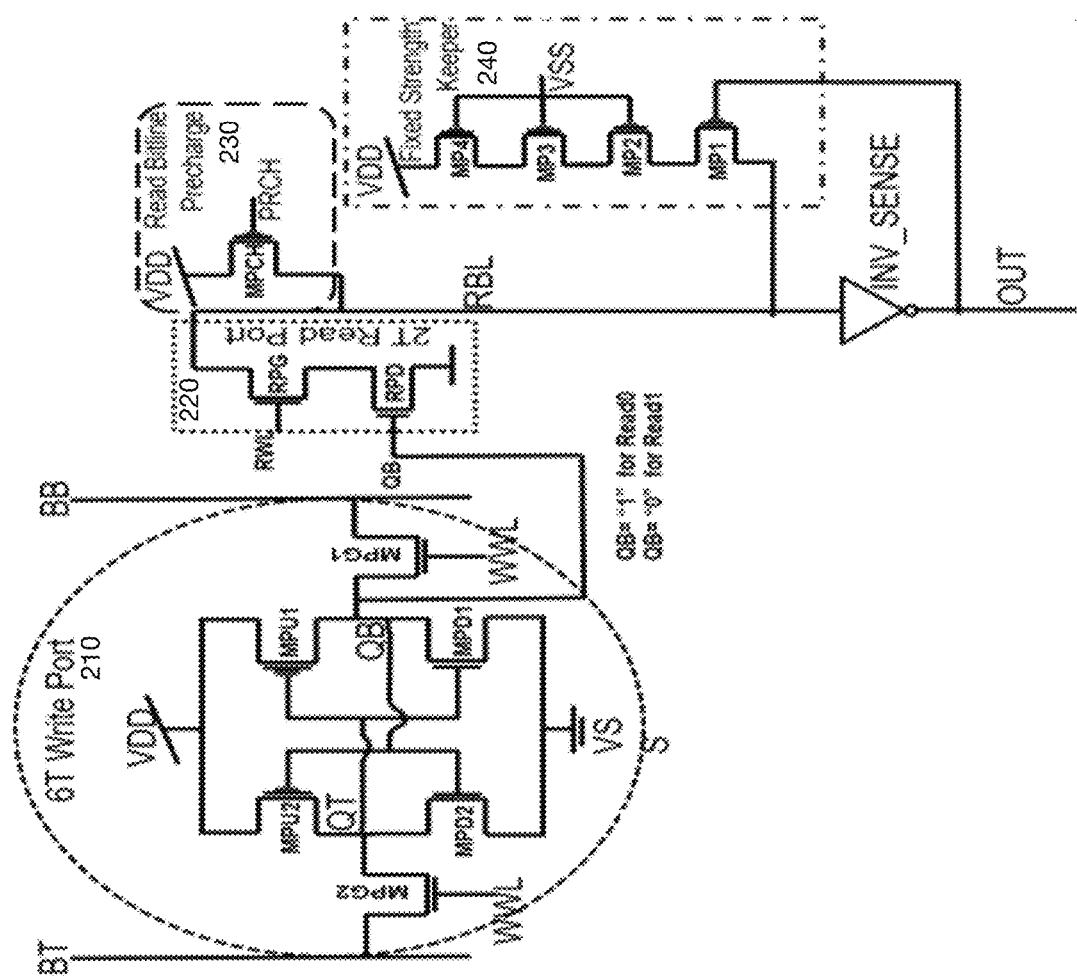
FIG. 2 is an illustration of a 8T SRAM with a fixed-strength keeper.

Aspects of the present disclosure relate to temperature tracked dynamic keeper implementation to enable ultralow voltage read operation for SRAMs. Ultralow voltage is a term of art which may refer to voltages in the range of 0.6V to 0.4V, for example. In this design implementation, the strength of the keeper changes dynamically based on the current design requirements. A high density 1R/1W SRAM macro based on 8T Static Random-Access Memory (SRAM) supports low voltage read1/read0 operations down to 0.5 v. The dynamic-strength keeper design supports reliable read operations in a large temperature range, in one embodiment between −40° C. and 150° C. in sub-10 nm FinFET technology. The self-modulated, dynamic-strength keeper has a drive strength modulated based on temperature. In this way, both read1 disturbances at high temperatures and read0 disturbances at cold temperatures are mitigated, extending a reliable read operation across a wide temperature range with added performance gain in access time and cycle time of memory.

The dynamic keeper in one embodiment may be implemented in an 8T SRAM. In a typical SRAM, each row of cells has a Read Word Line (RWL) attached to the read ports and a Write Word Line (WWL) attached to the write ports of the 6T (6 transistor) SRAM cells. Each column has a pair of complementary Write BitLines (WBL and WBLB) and for writing into the cell and Read BitLines (RBL) for reading from the cells. The write operation of the 8T SRAM is the same as that of a 6T SRAM, whose read operation is performed through the read port. The data is read from the cell through transistors, providing a decoupled read port.

During standby, all RBLs are pre-charged to VDD by using pre-charging positive metal oxide semiconductor (PMOS) devices. When the read cycle is activated, the pre-charging PMOSs are turned off, leaving read bit lines (RBLs) floating. The RBL is then discharged to ground if the accessed cell stores "0" and stays at VDD otherwise.

There are four currents associated with the read bitlines: Icell1, Icell0, Ileak1, and Ileak0, where Icell1 and Icell0 are the respective read currents sunk by the accessed cell when it stores a "1" and "0", respectively, and Ileak1 and Ileak0 are the leakage currents flowing through the other un-accessed cell(s) which store "1" and "0", respectively. Note that when a cell stores "1" (i.e., Q="1"), its complementary bit (i.e., QB="0") is applied to the gate of the pull-down negative metal oxide semiconductor (NMOS) M0 in the read port. But when Write word-line is turned on for same row, then the voltage of QB rises to a relatively small voltage (100-200 mV) and weakly turns on the pull-down "M0" NMOS. Icell1 is a weak subthreshold current and smaller than Icell0. Leakage current, Ileak0 and Ileak1 are not negligible, and become more significant under low voltage (low VDD), high temperature, and/or a large number of cells per read bit line. The leakage currents of unselected cells (Ileak0 and Ileak1) may discharge the read bit line. The combination of the read current sunk by the accessed cell (Icell1)+leakage current of the un-accessed cells (Ileak) can discharge RBL.

One way of addressing this issue is by inserting a keeper into the SRAM. A keeper is configured to maintain a voltage level on read bit line during a read operation. The keeper is a feedback circuit that helps the read bitline maintain at the full rail to compensate the leakage current of unselected bitcells during the read1 operation. To secure against read1 failure, the keeper must be able to maintain the RBL value, that is it must be strong enough to counter the leakage (Ileak0/Ileak1).

When there is a strong keeper on read bit line during read0 operation, then it destabilizes a read0 operation (reading a value "0" from an SRAM cell). In a read0 operation, a read port of the bit cell discharges the read bit line, and if a strong keeper is used in the design, it slows down the discharge, also referred to as fighting with bit cell read current during a read0 cycle. These read0 failures are prominent at low temperatures. For successful read0 operation, a very weak keeper is preferred on the read bit line during low temperature. Read0 and read1 have contradictory requirements for keeper design. Thus, optimizing the keeper in an 8T SRAM is very complex and requires the major design effort. Furthermore, this contradictory requirement limits the lowest operating voltage and degrades the performance in the normal voltage range. Typically, a stronger PMOS keeper is required at higher temperature, and a weaker PMOS keeper works well at lower temperatures. But as noted above, stronger PMOS keepers impact the 8T SRAM performance and limit the lower functional voltage at the SF/low temperature corner.

As discussed above, there are four currents associated with the read bitlines: Icell1, Icell0, Ileak1, and Ileak0, where Icell1 and Icell0 are the read currents sunk by the accessed cell when it stores a "1" and "0", respectively, and Ileak1 and Ileak0 are the leakage currents flowing through the other un-accessed cells which store "1" and "0", respectively. "Read1" happens in the bitcell when the stored value QT=1 (QB=0) and RBL remains at logic1, while "read0" happens when QT=0 (QB=1), which enables the RBL to discharge through discharging path sensed by inverter sense logic.

A keeper is configured to maintain a voltage level on read bit line during a read1 operation. In the present system, instead of a fixed-strength keeper, a dynamic keeper is implemented in which the keeper strength is varied based on the current temperature and voltage, and thus the keeper strength adapts its strength with temperature for optimal performance. This dynamic keeper, in one embodiment, includes two keeper configurations, such that the appropriate strength keeper is active based on the temperature. The keeper supports the read1 by "keeping" the RBL charged (=Supply voltage level) when it is reading a 1. Therefore, the keeper circuit should be strong enough to resist noise and leakage that would otherwise cause errant discharge to a Low state that trips the sense_inv. However, the keeper should be weak enough to support the read0 by allowing the RBL to quickly discharge when reading a 0, specifically at low temperature. It is difficult for a fixed-strength keeper to perform well over a range of different temperatures, because keeper strength should be relatively weak for low temperatures and relatively strong for higher temperatures for best performance and support ultralow voltage operation.

A dynamic keeper is used due to higher leakage current (Ileak1 and Ileak0) and strength sub-threshold current (Icell1) at higher temperatures. Leakage current at higher temperatures is 10-15× the leakage at lower temperatures. At low temperatures, "Ileak1 and Ileak0" are very minimal and require no keeper. The keeper is mainly used to counter the weak subthreshold current (Icell1). Icell1 is very small at low temperatures and requires a very weak keeper. Since, in typical designs, the keeper is set for a high temperature requirement, a stronger keeper at low temperature limits the lowest functional operating voltage and degrades the operation frequency in normal voltage range. Therefore, the present design utilizes a dynamic keeper implementation, in which the keeper strength changes dynamically by design need. This enables a stronger keeper at higher temperature to compensate for the stronger leakage (Ileak1 and Ileak0) and stronger sub-threshold (Icell1) discharge path, and a weaker keeper at low temperature to support weak sub-threshold (Icell1).

In one embodiment, a series of PMOS is used as the keeper, to support the "Icell1+Ileak . . . total. In one embodiment, a temperature sensor (in one embodiment, a PMOS diode) is used to dynamically change the stack of PMOS. In one embodiment, "X+Y" PMOS in series keeper or "1 NMOS and X PMOS" series keeper is used at lower temperatures. In one embodiment, when slow NMOS/fast PMOS (SF), fast NMOS/fast PMOS (FF), slow NMOS/slow PMOS (SS), or typical corner (TT) is at a low temperature, in one embodiment between −40° C. and moderate (55° C.-85° C.)), (SF_−40c/FF_−40c/SS_−40c/TT_−40c) the lower drive keeper is used. In one embodiment, a stronger "X PMOS" series keeper is used at high temperatures (in one embodiment between (moderate (55° C.-85° C.) to high temperature (150° C.) to resolve the leakage problem.

Figure 3:
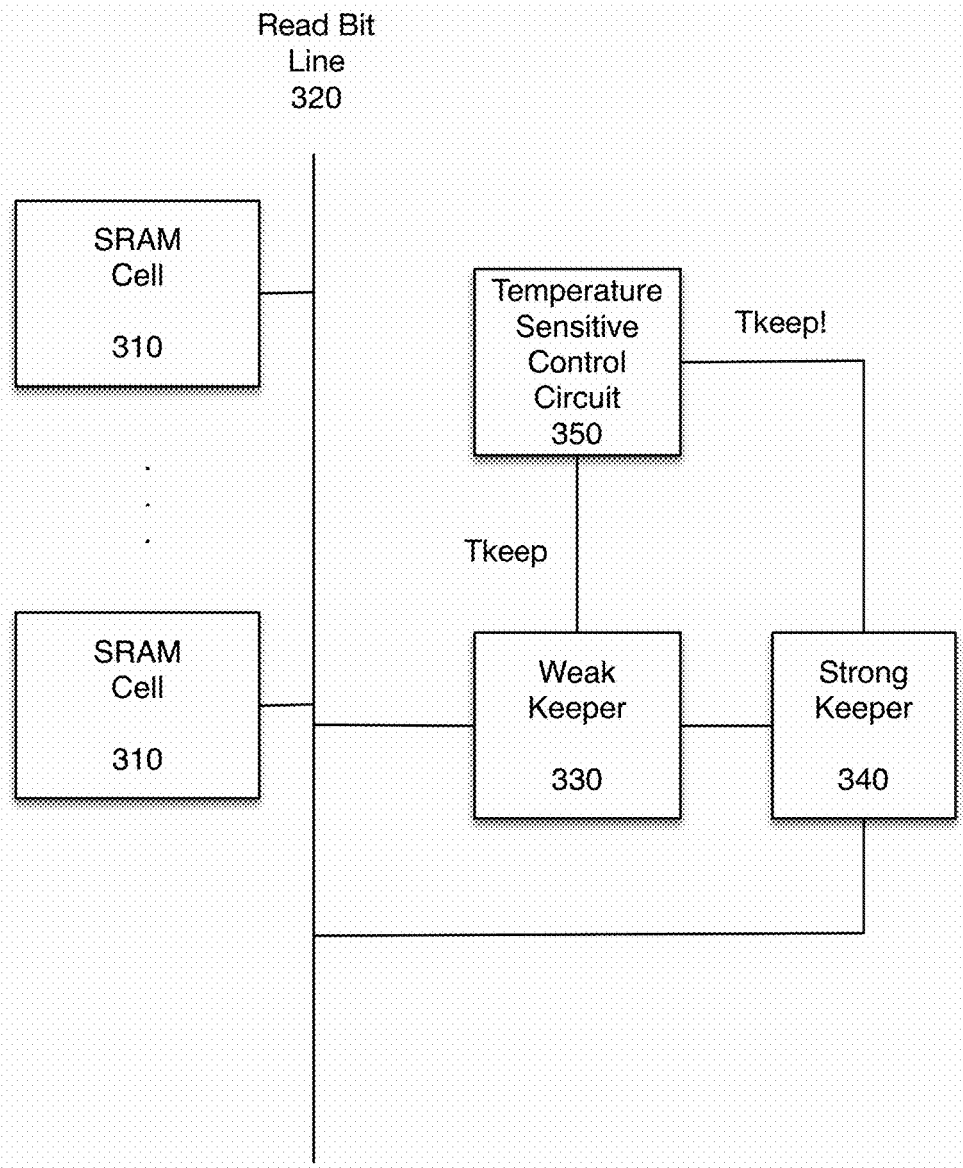
FIG. 3 is a block diagram of one embodiment of an SRAM with a dynamic keeper implementation.

FIG. 3 is a block diagram of one embodiment of the system. One or more SRAM cells 310 are coupled to the read bit line 320. The read bit line is coupled to the weak keeper 330, and to the strong keeper 340, either directly or through weak keeper 330. The weak keeper 330 and/or the strong keeper 340 are enabled by control circuit 350. In one embodiment, control circuit 350 utilizes Tkeep, and inverted Tkeep (Tkeep!) to enable the keepers. In one embodiment, control circuit 350 may be a temperature-sensitive delay circuit, as will be described below. In one embodiment, when the temperature is low (in one embodiment between −40° C. and moderate (55° C.-85° C.)) the weak keeper 330 is enabled, while at high temperatures, (moderate (55° C.-85° C.) to high (150° C.), the strong keeper 340 is enabled. In one embodiment, the keeper comprises a series of PMOS elements. In one embodiment, the system includes between three to six PMOS for one keeper. In some embodiments, a keeper may include a single PMOS and an NMOS. The keeper is designed to provide support to the RBL line, to enable a read0 without instability, and enable a read1 without the leakage causing false reads.

In one embodiment, the difference between the keepers is the strength of the PMOS circuits. In one embodiment, strength of keeper varies by enabling different threshold PMOS stack keepers, e.g., for a first temperature range (low (−40° C.) to some point within the moderate range (55° C.-85° C.)), a first PMOS stack having higher threshold PMOS devices is enabled, while for a second temperature range (some point within the moderate range (55° C.-85° C.) to high (150° C.)), a second PMOS stack having lower threshold PMOS stack keepers is enabled by a Tkeep signal. In one embodiment, which keeper is enabled at the moderate temperature range depends on operating conditions; however, either may be enabled without impacting the read0/read1 operation. Depending on an operating condition, the strength of the lower threshold PMOS devices is between 1.5 times and 4 times the strength of higher threshold devices. The strength of the keeper can also be controlled by having a larger device size for a stronger keeper and a smaller device size for weaker keeper.

In one embodiment, the keeper strength changes by varying the number of PMOS elements of the keeper, e.g., for a first temperature range (low (−40° C.) to moderate (55° C.-85° C.)), "m" number stack of PMOS will get enabled by Tkeepb signal, while for a second temperature range (moderate (55° C.-85° C.) to high (150° C.)), a smaller number of PMOS will be enabled by Tkeep signal. In one embodiment, the number of PMOS is "m-2", e.g. two fewer PMOS than at the first temperature range.

Figure 4:
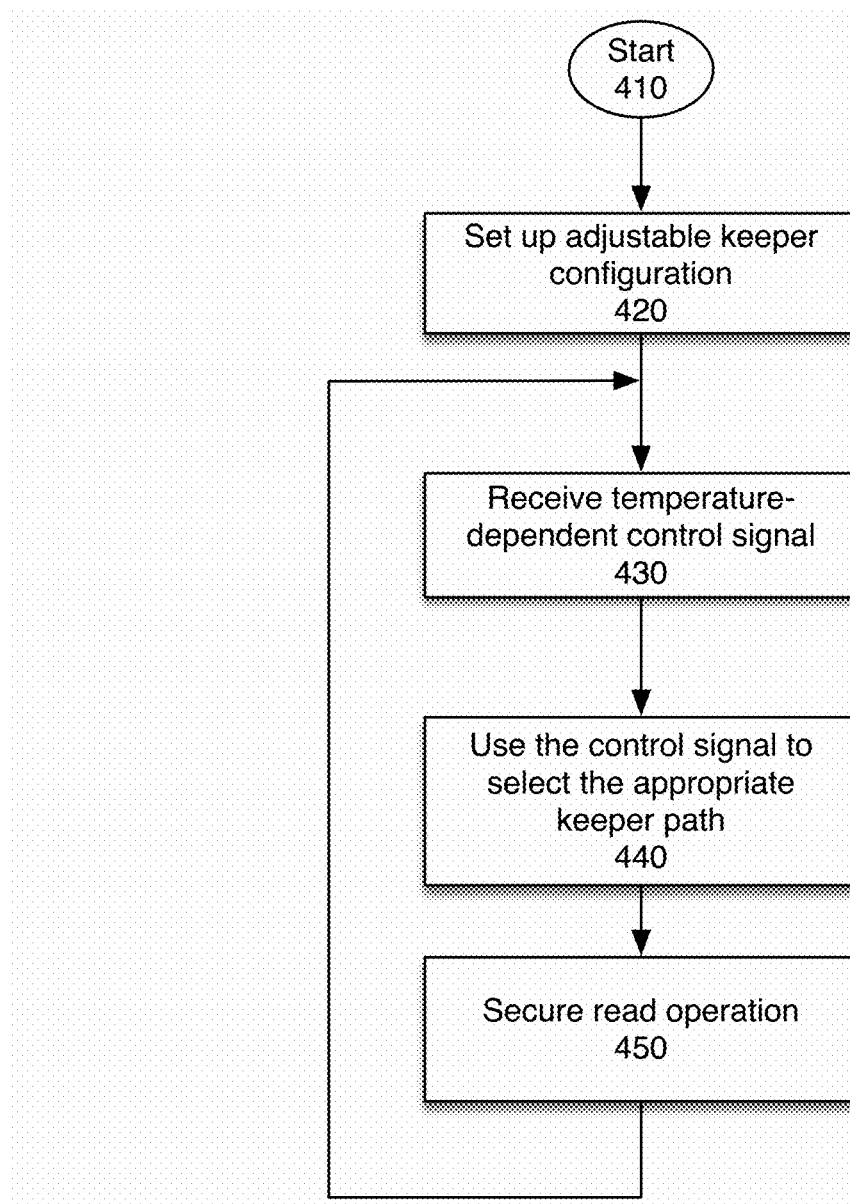
FIG. 4 is a flowchart of one embodiment of using the dynamic keeper.

FIG. 4 is a flowchart of one embodiment of using the dynamic keeper. The process starts at block 410. At block 420, the system is set up with the dynamic keeper, with a temperature-dependent control signal. At block 430, a temperature-dependent control signal is received. The temperature-dependent control signal, in one embodiment, is received from a temperature-sensitive delay circuit. The temperature-dependent control signal, in one embodiment, is received from a temperature-adjusted replica of the read bitline.

At block 440, the keeper path for the appropriate keeper(s) is selected by the control signal.

At block 450, the read operation is secured using the selected keeper path. This enables the system to use a stronger keeper at hotter temperatures to compensate for the larger leakage path, to ensure that the RBL remains at a high value during a read1 operation. However, because a low-power keeper is selected when the high-power keeper is not needed, the system can ensure that the read0 operation is successful at colder temperatures. The process continues to monitor the temperature and selectively enable the appropriate keeper, to ensure that each read operation is successful.

Figure 5:
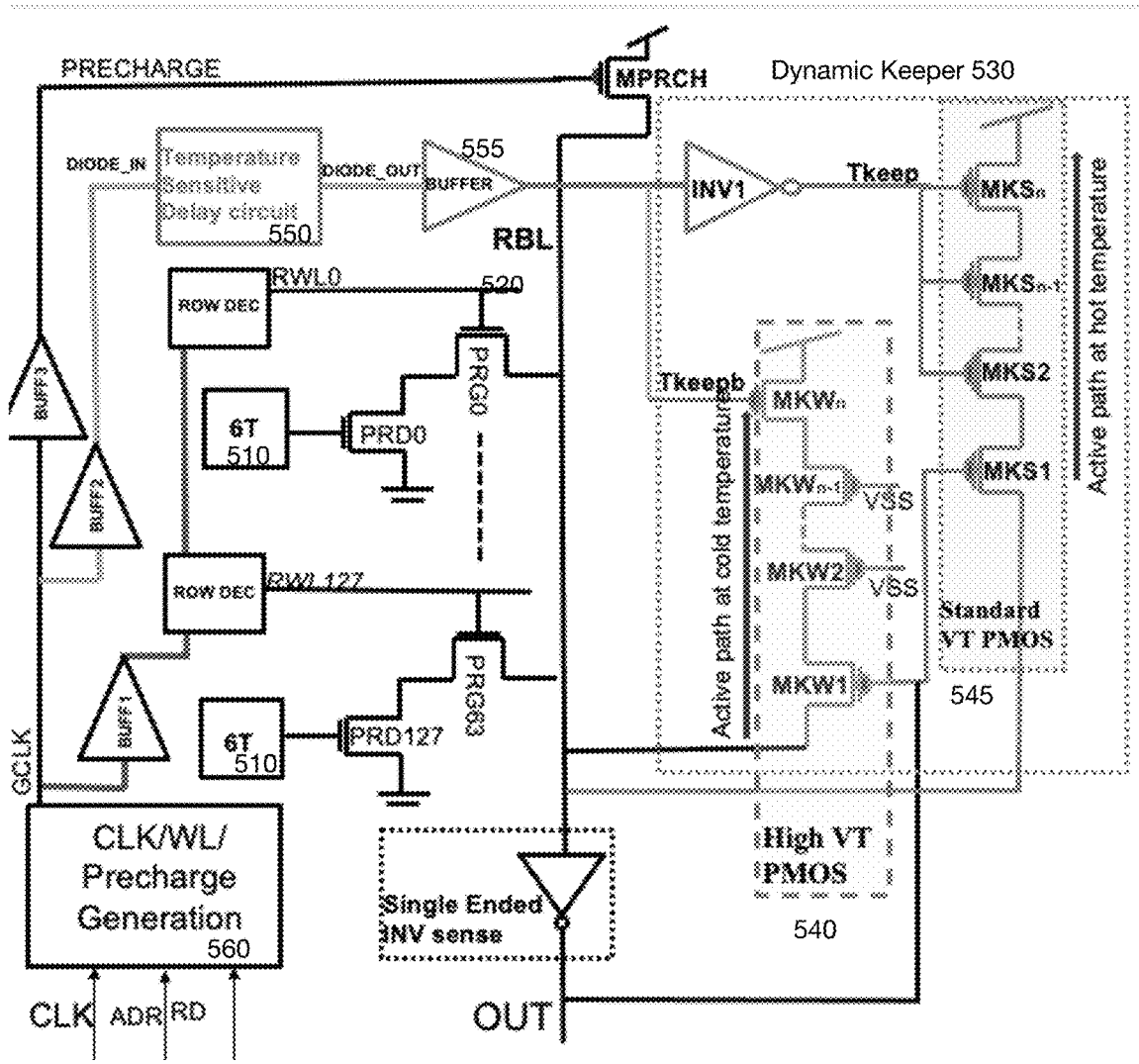
FIG. 5 is a circuit diagram of one embodiment of a dynamic keeper implementation.

FIG. 5 is a circuit diagram of one embodiment of a dynamic keeper implementation. To make the keeper functional at low voltage, the keeper strength is changed dynamically to have higher yield for combined Read 0/1 operation. The system includes a 6T SRAM 510, coupled to a read bit line (RBL) 520, as is known in the art. The click/write line/precharge generation 560 is coupled to a temperature-sensitive delay circuit 550. The input is signal diode_in. The output of the temperature-sensitive delay circuit 550 is signal diode_out. In one embodiment, signal diode_out is passed through buffer 555. The output of buffer 555 is the Tkeep! (inverted Tkeep) signal, which controls stacked keeper 530.

In one embodiment, a two different PMOS keeper stacked configuration is used. The standard VT PMOS 545 includes a set of standard threshold PMOS, MKS1-MKSn, which create a strong hold path, and are enabled by the Tkeep signal at high temperatures. The high VT PMOS 540, includes PMOS MKW1-MKWn, which are high threshold voltage transistors that create weak PMOS keeper 540. The activation of the PMOS keepers 540, 545 switches dynamically between standard threshold devices (strong keeper path) 545 and high threshold devices (weak keeper path) 540. At high temperatures, temperature-sensitive delay circuit 550 turns on the standard threshold "MKS1-MKSn"PMOS transistors in strong keeper path 545 to secure Read "1" failure against larger leakage on RBL. At the start of the read cycle, the weak strength PMOS Keeper 540 is coupled into the system to support the leakage. The last PMOS in the standard PMOS keeper 545 has its gate coupled to the gate of the last PMOS in the high VT PMOS 540, to provide a feedback loop to disable the keeper once the read0 has been completed.

The signal "Tkeep" is generated through temperature-sensitive delay circuit 550. The "Tkeep" signal activates the strong keeper path 540, after delay "Temp_delay" and in parallel disables the weak PMOS keepers 545. The delay from temperature-sensitive delay circuit 550 generates a longer delay ("Temp_delay@−40c>>Temp_delay@150c") at cold temperatures such that the weak PMOS keeper path is active in read 0 cycle.

Figure 6:
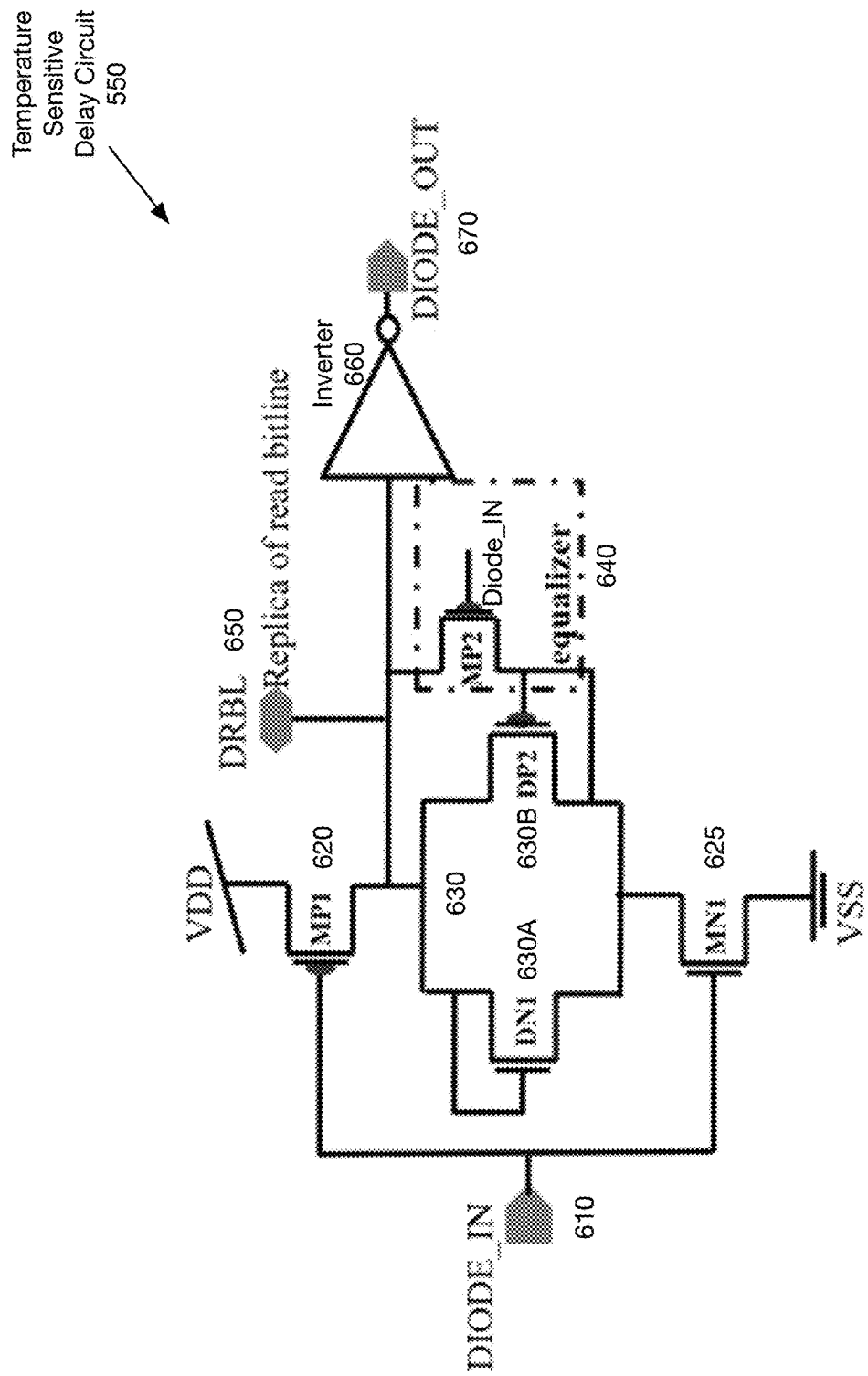
FIG. 6 is a circuit diagram of one embodiment of the temperature-sensitive delay circuit.

FIG. 6 is a circuit diagram of one embodiment of the temperature-sensitive delay circuit. The diode configuration of NMOS and PMOS transistors 630 (gate and drain are shorted) are used to generate temperature-sensitive delay in circuit, both NMOS 630A and PMOS 630B balance the system across the skewed process.

When 8T SRAM operates at cold temperature and low voltage, the threshold voltage of the transistors 630 is increased and the reduced effective VGS of transistors 630 changes the delay of the signal. Temperature delay circuit 550 is activated at a rising edge of external signal CLK, in one embodiment. Diode-in signal 610 provides the activation. The output signal "Tkeep" of this circuit is used to activate the strong PMOS keeper's circuity in one embodiment. The circuit delay at low temperatures is almost ~10× more than at a high temperature. That is sufficient to keep the stronger PMOS keeper disabled during Read "0" operation at cold temperature. The MN 1 625 activates the delay circuit for a read operation, and MP 1 620 inactivates the delay circuit in a static state.

Figure 7:
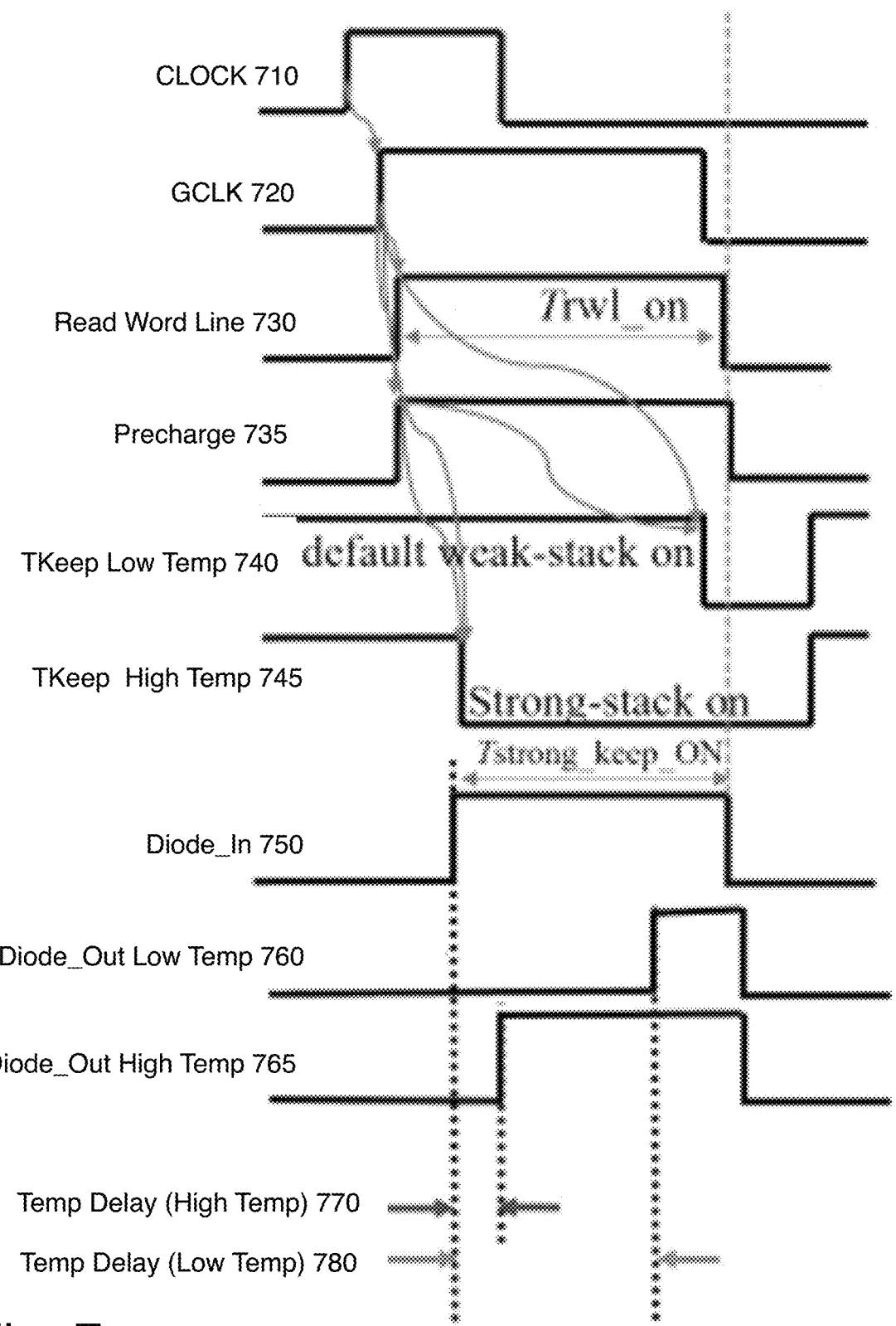
FIG. 7 is a signal diagram showing the timing of signals in the dynamic keeper implementation of FIG. 5.

FIG. 7 is a signal diagram showing the timing of signals in the dynamic keeper implementation of FIG. 5. The clock signal CLK 710 triggers global clock GCLK 720, and read word line signal (RWL) 730, and pre-charge signal (PRCH) 735. The time between the diode_in signal, which is input to the temperature delay circuit 550 and when the diode_out is turned on depends on the temperature. The output (diode_out low temp 760 or diode_out high temp 765) are turned on, at different times. The delay 770, 780 shows that at high temperature, the short delay 770 means that the strong keeper is turned on quickly, while at the low temperature, the delay 780 is long enough that the weak keeper is used.

The "Tkeep" signal generation delay is comparable to normal buffer delays on hot temperature ("Temp_delay"=~2*inverter delay) and it activates the stronger keeper path to sustain the leakage path. With the proposed dynamic keeper implementation, PMOS keeper strength changes adaptively with temperature for reliable read0 and read1 operations to enable low voltage functionality. As can be seen, the diode out when the temperature is low is delayed compared to when the temperature is high.

A qualitative comparison with existing approaches is shown in Table 1. The design shows better Vmin and enables low voltage operation 0.5 v without increasing the area of bitcell.

| Comparison for 1R1W with Other Designs | | | |
|---|---|---|---|
| Technology (urn) | Large Sub 10 nm | 14 nm | 22 nm Current Design Sub 10 nm |
| Vmin (v) | 0.3 | 0.56 | - 0.5 |
| SRAM Cell | 10T | 8T | 8T 8T |
| Temp (C.) | -40c to150c | -10c to 95c | - -40c to 150c |
| Sensing Scheme | Large | Small | Large Large |

Figure 8:
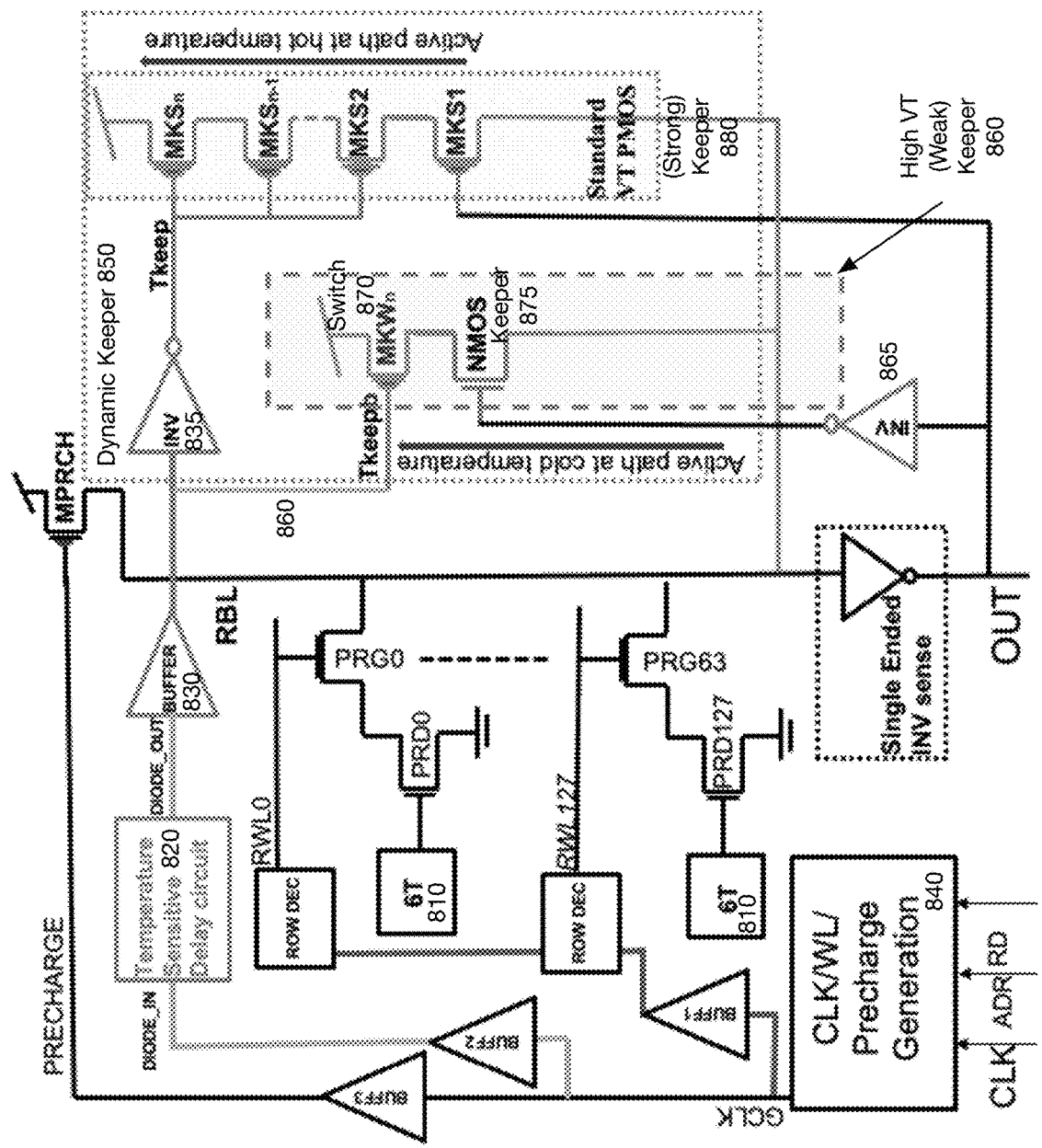
FIG. 8 is a circuit diagram of another embodiment of a dynamic keeper implementation.

FIG. 8 is a circuit diagram of another embodiment of a dynamic keeper implementation. The system includes a temperature-sensitive delay circuit 820, which receives a diode_in signal from CLK/WL/Precharge generation 840. The output of the temperature-sensitive delay circuit 820 is diode_out signal, which passes through buffer 830.

The output of buffer 830 passes through inverter 835. The output of inverter 835 is Tkeep signal. The Tkeep signal controls the dual keepers 850. The Tkeep signal controls the high VT keeper 860. The inverted Tkeep signal (Tkeepb) controls the standard VT keeper 880. When the inverted Tkeep signal (Tkeepb) controls the PMOS switch 870, which turns in the high VT (weak) keeper 860, of the dual keepers 850. The high VT keeper 860 is activated by PMOS switch 870. When it's active, the NMOS keeper 875 is activated, and the high VT keeper 860 is active. When the temperature is high, the Tkeep signal activates the standard (strong) keeper 880. The stack of PMOS in the standard keeper 880 provide support at high temperature. The gate of the NMOS keeper 875 is coupled to the gate of the last PMOS element in the strong keeper 880, through inverter 865.

Figure 9:
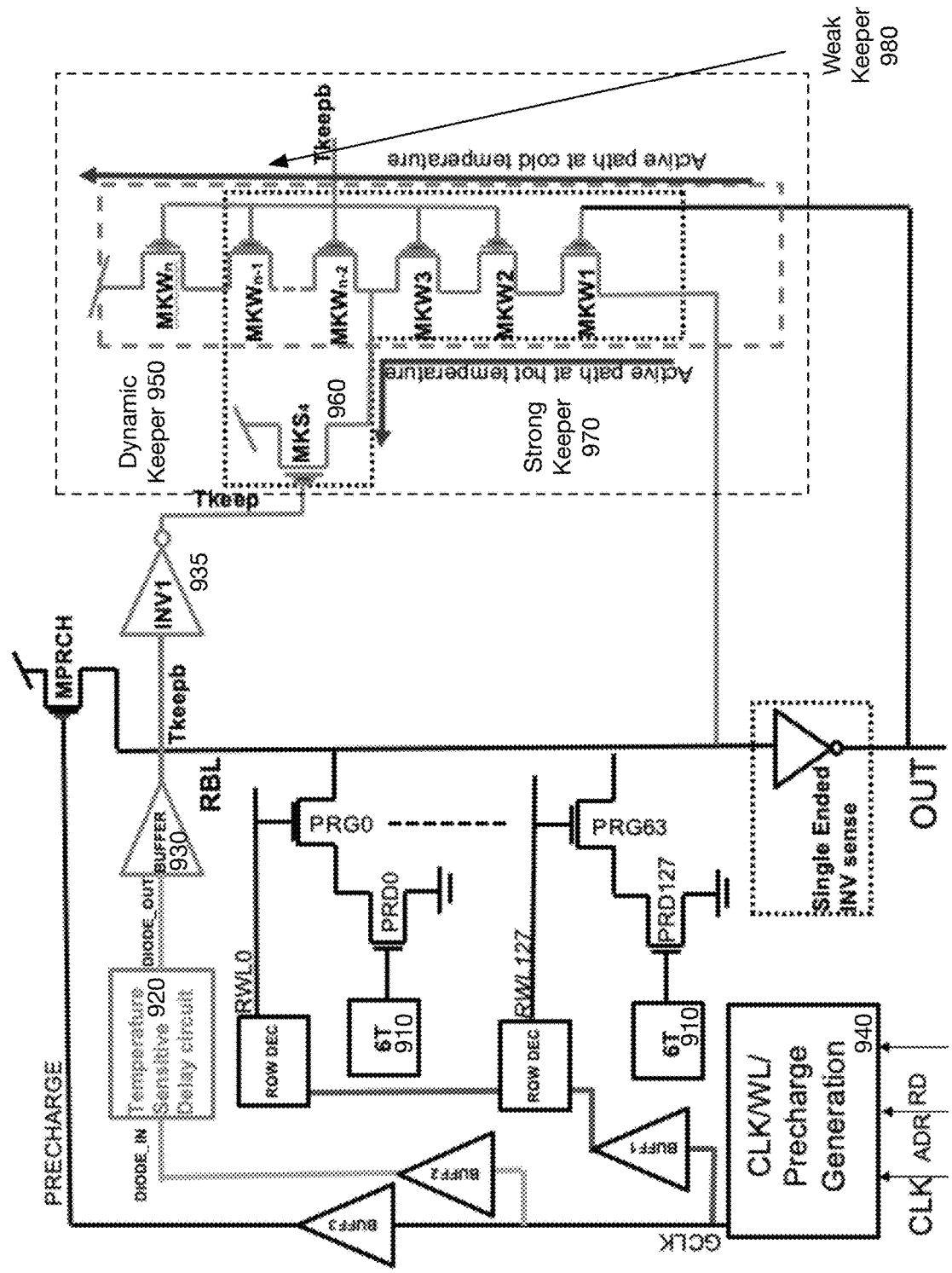
FIG. 9 is a circuit diagram of another embodiment of a dynamic keeper implementation.

FIG. 9 is a circuit diagram of another embodiment of a dynamic keeper implementation. The system includes a temperature-sensitive delay circuit 920, which receives a diode_in signal from CLK/WL/Precharge generation 940. The output of the temperature-sensitive delay circuit 920 is diode_out signal, which passes through buffer 930. The output of buffer 930 passes through inverter 935. The output of inverter 935 is Tkeep signal. The Tkeep signal controls the dynamic keeper 950.

The Tkeep signal controls the PMOS switch 960 which activates the path through the dynamic keeper 950 for the high temperature path, e.g. the strong keeper 970. When the PMOS switch 960 is on, the signal flows through a subset of the series keeper PMOS elements, shown here as MKS4, MKW3, MKW2, MKW1. The inverted Tkeepb signal activates the full set of series PMOS keepers MKW1 through MKWn for the cold temperature path, e.g., the weak keeper 980. The smaller number of stacked PMOS in the high temperature path provides a lower resistive path, which results in higher current, to counter the leakage on unselected bitcells. In this embodiment, stack size (e.g. the number of PMOS elements in a keeper) is used to create the strong and weak keepers, rather than High VT/Standard VT PMOS elements. One of skill in the art would understand that both, the use high VT/standard VT PMOS and numbers of PMOS per keeper, may be varied in each of the above embodiments, to provide the level of keeper support needed.

Figure 10:
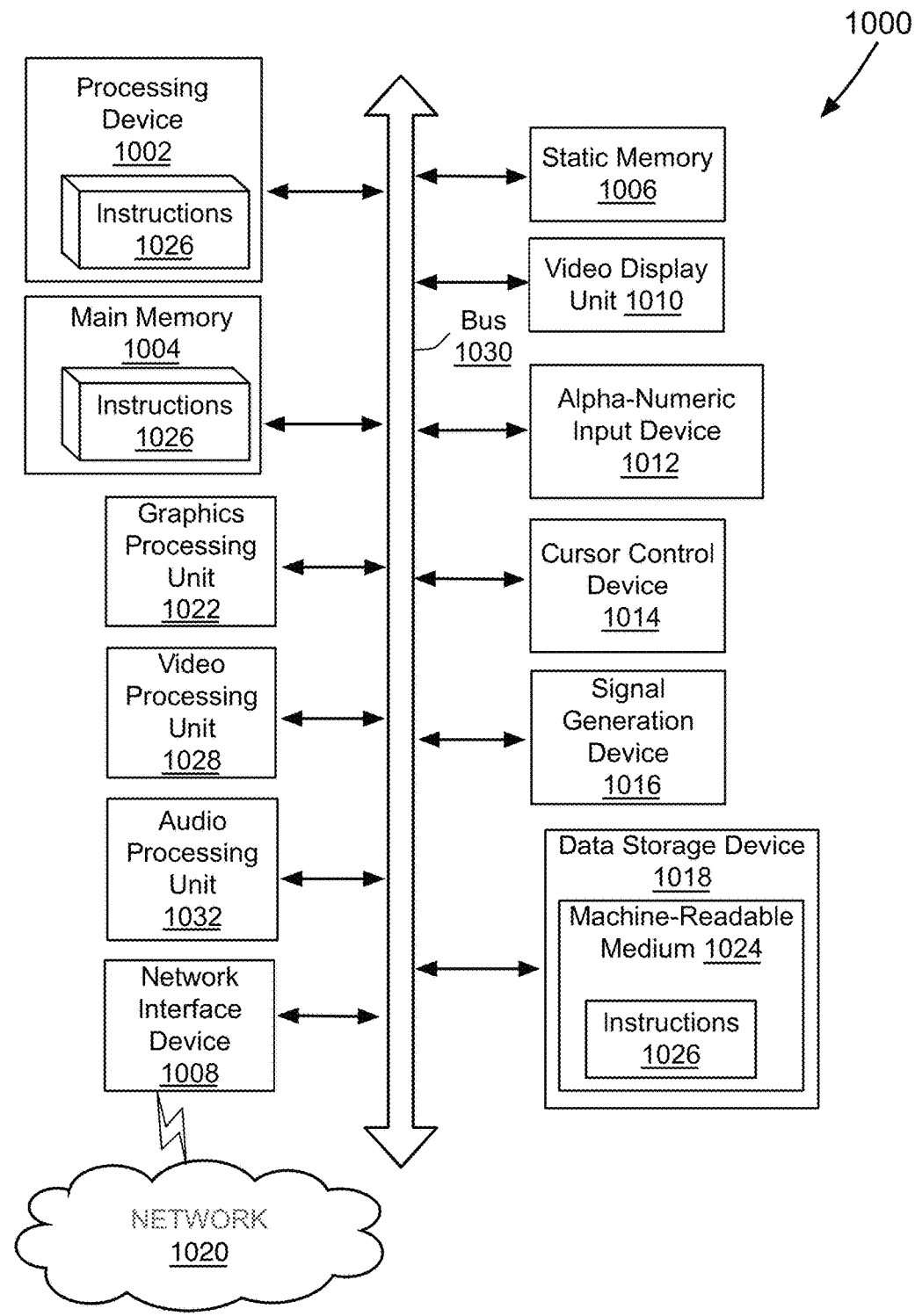
FIG. 10 depicts an abstract diagram of an example computer system in which embodiments of the present disclosure may operate.

FIG. 10 depicts an abstract diagram of an example computer system in which embodiments of the present disclosure may operate. The computer system 1000 within which a set of instructions may be executed is described. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM), a static memory 1006 (e.g., flash memory, static random access memory (SRAM), etc.), and a data storage device 1018, which communicate with each other via a bus 1030.

Processing device 1002 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 may also be one or more special-purpose processing devices such as an application specific integrated circuit (ASIC), a field programmable gate array (FPGA), a digital signal processor (DSP), network processor, or the like. The processing device 1002 may be configured to execute instructions 1026 for performing the operations and steps described herein.

The computer system 1000 may further include a network interface device 1008 to communicate over the network 1020. The computer system 1000 also may include a video display unit 1010 (e.g., a liquid crystal display (LCD) or a cathode ray tube (CRT)), an alphanumeric input device 1012 (e.g., a keyboard), a cursor control device 1014 (e.g., a mouse), a graphics processing unit 1022, a signal generation device 1016 (e.g., a speaker), graphics processing unit 1022, video processing unit 1028, and audio processing unit 1032.

The data storage device 1018 may include a machine-readable storage medium 1024 (also known as a non-transitory computer-readable medium) on which is stored one or more sets of instructions 1026 or software embodying any one or more of the methodologies or functions described herein. The instructions 1026 may also reside, completely or at least partially, within the main memory 1004 and/or within the processing device 1002 during execution thereof by the computer system 1000, the main memory 1004 and the processing device 1002 also constituting machine-readable storage media.

In some implementations, the instructions 1026 include instructions to implement functionality corresponding to the present disclosure. While the machine-readable storage medium 1024 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1002 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A static random access memory (SRAM) system comprising:
    a plurality of SRAM storage cells, each of the plurality of SRAM storage cells coupled to a respective read bit line;
    a dynamic keeper circuit coupled to the read bit line, the dynamic keeper circuit comprising a first keeper circuit and a second keeper circuit,
        the first keeper circuit is enabled to support the read bit line during a read1 operation at a first temperature range, and
        the second keeper circuit is enabled to support the read bit line during a read0 operation at a second temperature range, wherein the second temperature range is higher than the first temperature range; and a temperature-sensitive control circuit to enable one of the first keeper circuit or the second keeper circuit based on a temperature within the first temperature range and the second temperature range.

2. The SRAM of claim 1, wherein the temperature-sensitive control circuit comprises a temperature-sensitive delay circuit, to delay an output based on the temperature.

3. The SRAM of claim 2, wherein the temperature-sensitive delay circuit comprises:

a diode configuration of N-type metal-oxide-semiconductor (NMOS) and P-type metal-oxide-semiconductor (PMOS) transistors to generate a temperature-sensitive delay in the output of the temperature-sensitive delay circuit.

4. The SRAM of claim 3, wherein for the first temperature range, the temperature-sensitive delay circuit has a long delay enabling the read0 operation at ultralow voltage, and for the second temperature range the temperature-sensitive delay circuit has a short delay, enabling the dynamic keeper circuit to support the read1 operation.

5. The SRAM of claim 2, wherein the first keeper circuit comprises:

a PMOS switch controlled by an inverted Tkeep signal, output by the temperature-sensitive delay circuit; and a weak NMOS keeper circuit to support read0 operation at the first temperature range.

6. The SRAM of claim 1, wherein the second keeper circuit comprises:

a plurality of larger PMOS, controlled by a Tkeep signal.

7. The SRAM of claim 1, wherein:

the first keeper circuit comprises a first series of PMOS elements, activated by an inverted Tkeep signal output by the temperature-sensitive control circuit; and the second keeper circuit comprises a second series of PMOS elements, activated by a Tkeep signal output by the temperature-sensitive control circuit.

8. The SRAM of claim 7, wherein the first series of PMOS elements are smaller than the second series of PMOS elements.

9. The SRAM of claim 7, wherein the first series of PMOS elements is a subset of the second series of PMOS elements.

10. The SRAM of claim 1, wherein the dynamic keeper circuit comprises:

a PMOS switch;

a full set of PMOS elements comprising the second keeper circuit; and a subset of the full set of PMOS elements comprising the first keeper circuit, wherein the PMOS switch determines whether the full set or the subset is selected.

11. The SRAM of claim 1, wherein the first keeper circuit is activated for temperatures between −40 degrees Celsius and a moderate temperature, and the second keeper circuit is activated for temperatures above the moderate temperature to 150 degrees Celsius.

12. A method of providing a dynamic keeper circuit to maintain signal in a static random access memory (SRAM) read bit line, the method comprising:

coupling a dynamic keeper circuit to the read bit line, the dynamic keeper circuit comprising a first keeper circuit and a second keeper circuit;

receiving a signal from a temperature-sensitive control circuit, the signal based on a temperature;

selecting the first keeper circuit at a first temperature range to support the read bit line during a read1 operation or the second keeper circuit at a second temperature range to enable the second keeper circuit to support the read bit line during a read0 operation, where the second temperature range is higher than the first temperature range.

13. The method of claim 12, wherein the temperature-sensitive control circuit comprises a temperature-sensitive delay circuit, to delay an output based on temperature.

14. The method of claim 13, further comprising:

generating a temperature-sensitive delay in the output of the temperature-sensitive delay circuit.

15. The method of claim 14, wherein for the first temperature range, the temperature-sensitive delay circuit has a long delay enabling the read0 operation at ultralow voltage, and for the second temperature range, higher than the first temperature range, the temperature-sensitive delay circuit has a short delay, enabling the dynamic keeper circuit to support the read1 operation.

16. The method of claim 13, wherein the first keeper circuit comprises a PMOS switch controlled by an inverted Tkeep signal, output by the temperature-sensitive delay circuit and a weak NMOS keeper circuit to support read0 operation at the first temperature range, and the second keeper circuit comprises a plurality of larger PMOS, controlled by a Tkeep signal.

17. The method of claim 12, wherein the first keeper circuit comprises a first series of PMOS elements, activated by an inverted Tkeep signal output by the temperature-sensitive control circuit, and the second keeper circuit comprises a second series of PMOS elements, activated by a Tkeep signal output by the temperature-sensitive control circuit.

18. The method of claim 17, wherein one or more of: the first series of PMOS elements are smaller than the second series of PMOS elements, and the first series of PMOS elements is a subset of the second series of PMOS elements.

19. The method of claim 17, wherein selecting the active keeper circuit in the dynamic keeper circuit comprises one of:

switching in a full set of the PMOS elements for the second keeper circuit; or switching in a subset of the PMOS elements for the first keeper circuit.

20. The method of claim 12, wherein the first keeper circuit is activated for temperatures between −40 degrees Celsius and a moderate temperature, and the second keeper circuit is activated for temperatures above the moderate temperature to 150 degrees Celsius.

* * * * *